United States Patent
Ryu et al.

(10) Patent No.: US 8,897,055 B2
(45) Date of Patent: Nov. 25, 2014

(54) MEMORY DEVICE, METHOD OF OPERATING THE SAME, AND ELECTRONIC DEVICE HAVING THE MEMORY DEVICE

(71) Applicant: Samsung Electronics Co., Ltd., Suwon-si, Gyeonggi-do (KR)

(72) Inventors: Je-Min Ryu, Seoul (KR); Gil-Su Kim, Hwaseong-si (KR); Jong-Min Oh, Seoul (KR); Sung-Min Seo, Seoul (KR); Ho-Young Song, Hwaseong-si (KR); Yong-Ho Cho, Suwon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 100 days.

(21) Appl. No.: 13/771,633

(22) Filed: Feb. 20, 2013

(65) Prior Publication Data

US 2013/0322149 A1 Dec. 5, 2013

(30) Foreign Application Priority Data

May 31, 2012 (KR) ......................... 10-2012-0058374

(51) Int. Cl.
| | | |
|---|---|---|
| *G11C 17/16* | (2006.01) | |
| *G11C 29/00* | (2006.01) | |
| *G11C 7/10* | (2006.01) | |
| *G11C 17/18* | (2006.01) | |

(52) U.S. Cl.
CPC .............. *G11C 17/16* (2013.01); *G11C 29/802* (2013.01); *G11C 7/1045* (2013.01); *G11C 17/18* (2013.01)
USPC .......................... 365/96; 365/189.2; 365/225.7

(58) Field of Classification Search
CPC .... G11C 7/1045; G11C 17/16; G11C 17/165; G11C 17/18; G11C 29/027; G11C 29/802
USPC .......................... 365/96, 189.2, 225.7, 230.03
See application file for complete search history.

(56) References Cited

U.S. PATENT DOCUMENTS

| | | | |
|---|---|---|---|
| 5,859,801 A * | 1/1999 | Poechmueller | ............... 365/200 |
| 6,088,282 A * | 7/2000 | Loughmiller et al. | ...... 365/225.7 |
| 7,307,529 B2 * | 12/2007 | Gutnik et al. | ............... 340/572.1 |
| 7,746,719 B2 * | 6/2010 | Kang | ......................... 365/225.7 |
| 7,826,296 B2 | 11/2010 | Kim et al. | |
| 2004/0261049 A1 | 12/2004 | Mohr et al. | |
| 2006/0072364 A1 | 4/2006 | Yoshida et al. | |
| 2007/0168774 A1 | 7/2007 | Mohr et al. | |

(Continued)

FOREIGN PATENT DOCUMENTS

| | | |
|---|---|---|
| JP | 11-203887 | 7/1999 |
| JP | 2002-251889 A | 9/2002 |
| KR | 2007-0110628 A | 11/2007 |
| KR | 2009-0070862 A | 7/2009 |

*Primary Examiner* — Tan T. Nguyen
(74) *Attorney, Agent, or Firm* — Muir Patent Consulting, PLLC

(57) ABSTRACT

A memory device includes a memory cell array and a fuse device. The fuse device includes a fuse cell array and a fuse control circuit. The fuse cell array includes a first fuse cell sub-array which stores first data associated with operation of the fuse control circuit, and a second fuse cell sub-array which stores second data associated with operation of the memory device. The fuse control circuit is electrically coupled to the first and second fuse cell sub-arrays, and is configured to read the first and second data from the first and second fuse cell sub-arrays, respectively.

20 Claims, 18 Drawing Sheets

(56) References Cited

U.S. PATENT DOCUMENTS

| | | |
|---|---|---|
| 2007/0217247 A1 | 9/2007 | Chen et al. |
| 2009/0059682 A1 | 3/2009 | Park et al. |
| 2009/0168581 A1 | 7/2009 | Im et al. |
| 2010/0165699 A1 | 7/2010 | Chen et al. |
| 2010/0202183 A1 | 8/2010 | Kurjanowicz |
| 2011/0209011 A1 | 8/2011 | Mohr et al. |

* cited by examiner

MEMORY DEVICE, METHOD OF OPERATING THE SAME, AND ELECTRONIC DEVICE HAVING THE MEMORY DEVICE

CROSS-REFERENCE TO RELATED APPLICATIONS

This application claims priority under 35 U.S.C. §119(a) to Korean Patent Application No. 10-2012-0058374 filed on May 31, 2012, the disclosure of which is hereby incorporated by reference in its entirety.

BACKGROUND

Example embodiments relate to memory devices, and more particularly, to a method of reading data from a fuse device included in a memory device, and devices using the method.

One-time programmable (OTP) memory may be used in micro controller unit (MCU), power management IC (PMIC), display driver IC (DDI), CMOS image sensor, or the like. OTP memory may be programmed by disconnecting a connection of a fuse implemented in a circuit of the OTP memory or by generating a connection of an anti-fuse implemented in the circuit of the OTP memory.

In general, once OTP memory performs programming, programmed data is irreversible. Accordingly, the programming of the OTP memory is performed after the manufacture of the OTP memory in consideration of a final purpose.

Resistive fuse devices that may be implemented in OTP memory may each be in an open state or a short state due to a current equal to or greater than a predetermined value. An anti-fuse that may be used in OTP memory may be implemented as a thin layer including a non-conductive material, for example, silicon dioxide, between two conductive layers or two terminals. The two conductive layers or the two terminals may serve as conductive paths that are shorted due to a voltage equal to or greater than a predetermined value or have low resistance components.

When OTP memory is included in a semiconductor memory device, the OTP memory may store a variety of data necessary for an operation of the semiconductor memory device. In this case, the OTP memory may be implemented in the shape of an array including a plurality of fuses or a plurality of anti-fuses, in order to efficiently store the variety of data.

SUMMARY

According to one embodiment, there is provided a memory device including a memory cell array and a fuse device. The fuse device includes a fuse cell array and a fuse control circuit. The fuse cell array includes a first fuse cell sub-array and a second fuse cell sub-array. The first fuse cell sub-array is configured to store first data associated with operation of the fuse control circuit, and the second fuse cell sub-array is configured to store second data associated with operation of the memory device. The fuse control circuit is electrically coupled to the first and second fuse cell sub-arrays, and is configured to read the first and second data from the first and second fuse cell sub-arrays, respectively.

According to another embodiment, there is provided a method for reading data from a fuse device including a fuse cell array and a fuse control circuit electrically coupled to the fuse cell array. The fuse device may be included in a memory device including a memory cell array and a memory control circuit electrically coupled to the memory cell array. The method includes reading first data from a first fuse cell sub-array of the fuse cell array. The first data may be associated with operation of the fuse control circuit. After reading the first data, reading second data from a second fuse cell sub-array of the fuse cell array. The second data may be associated with operation of the memory device.

According to further another embodiment, there is provided a memory device. The memory device includes a memory cell array, a memory control circuit, a first fuse cell array, a second cell array, and a fuse control circuit. The memory cell array includes a plurality of memory cells coupled to a plurality of word lines and a plurality of bit lines. The memory control circuit is configured to select one or more memory cells in the memory cell array. The first fuse cell array includes a plurality of fuse cells coupled to a first plurality of fuse word lines and a first plurality of fuse bit lines. The first fuse cell array is configured to store first data associated with operation of the fuse control circuit. The second fuse cell array includes a plurality of fuse cells coupled to a second plurality of fuse word lines and a second plurality of fuse bit lines. The second fuse cell array is configured to store second data associated with operation of the memory device. The fuse control circuit is configured to read the first and second data from the first and second fuse cell arrays, respectively, and to transfer the data to the memory control circuit.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
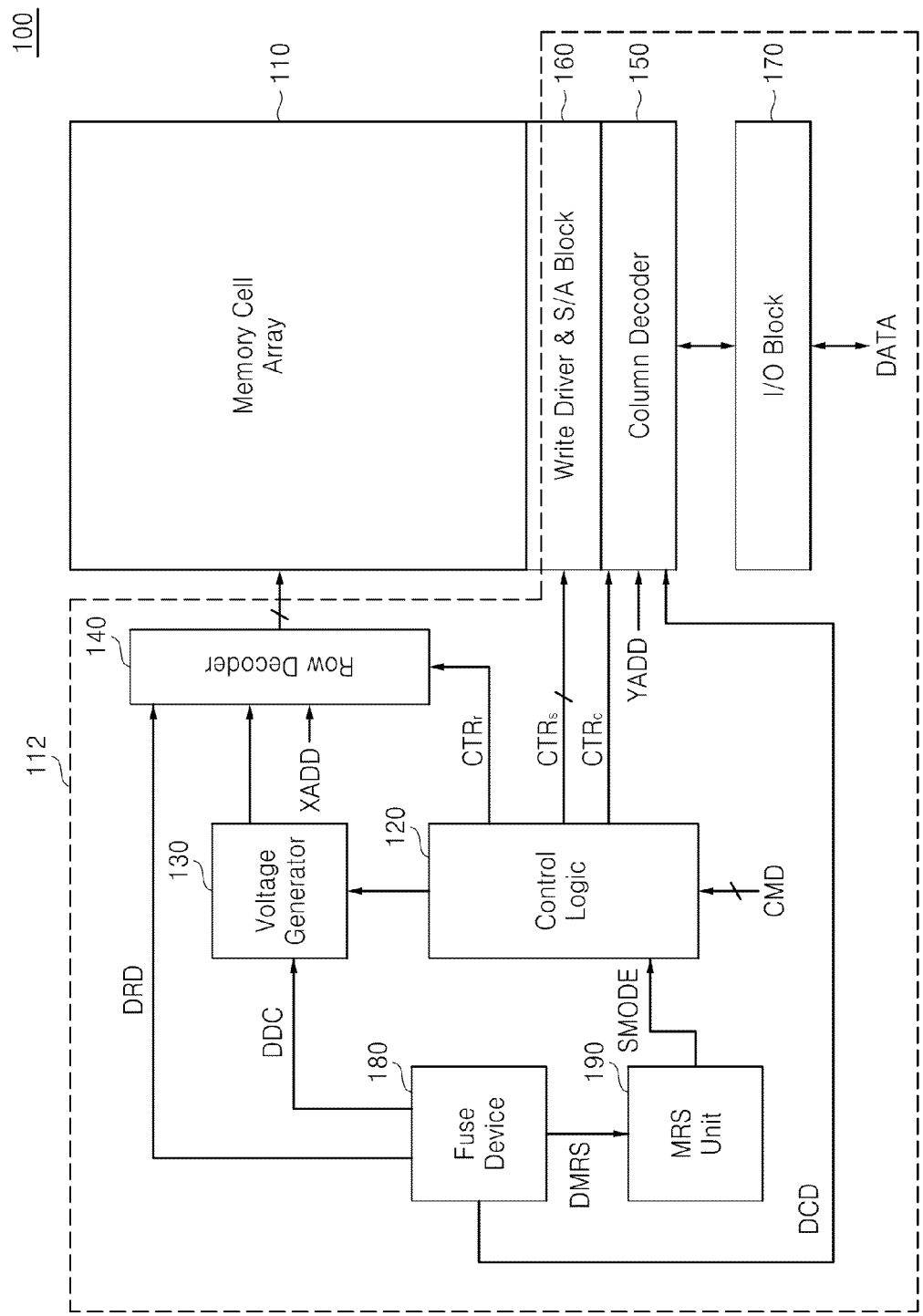
FIG. 1 is a block diagram of a memory device according to one embodiment.

Example embodiments of the present disclosure are described below in sufficient detail to enable those of ordinary skill in the art to embody and practice the present disclosure. It is important to understand that the present disclosure may be embodied in many alternate forms and should not be construed as limited to the example embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the disclosure, such elements should not be construed as limited by these terms unless the context indicates otherwise. For example, a first element could be termed a second element, and a second element could be termed a first element, without departing from the scope of the present invention disclosure. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the invention disclosure is not intended to limit the scope of the invention disclosure. The articles "a," "an," and "the" are singular in that they have a single referent, however the use of the singular form in the present document should not preclude the presence of more than one referent. In other words, elements of the invention disclosure referred to in the singular may number one or more, unless the context clearly indicates otherwise. It will be further understood that the terms, such as "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein are to be interpreted as is customary in the art to which this disclosure belongs. It will be further understood that terms in common usage should also be interpreted as is customary in the relevant art and not in an idealized or overly formal sense unless expressly so defined herein.

FIG. 1 is a block diagram of a memory device 100 according to one embodiment. Referring to FIG. 1, the memory device 100 includes a memory cell array 110 and memory control circuit 112.

The memory device 100 may be implemented by using a volatile memory device or a non-volatile memory device. The volatile memory device may be implemented by using, for example, a dynamic random access memory (DRAM), a static random access memory (SRAM), a thyristor RAM (T-RAM), a zero capacitor RAM (Z-RAM), or a Twin Transistor RAM (TTRAM).

The non-volatile memory device may be implemented by using, for example, an electrically erasable programmable read-only memory (EEPROM), a flash memory, a magnetic RAM (MRAM), a spin-transfer torque MRAM (STT-MRAM), a conductive bridging RAM (CBRAM), a ferroelectric RAM (FeRAM), a phase change RAM (PRAM), a resistive RAM (RRAM), a nanotube RRAM, a polymer RAM (PoRAM), a nano floating gate memory (NFGM), a holographic memory, a molecular electronics memory device, an insulator resistance change memory, or the like.

The memory cell array 110 may include a plurality of memory cells that store data. Each of the plurality of memory cells may be connected to one of a plurality of word lines and one of a plurality of bit lines. The memory cell array 110 may be implemented to have a two-dimensional structure or to have a three-dimensional structure.

The memory control circuit 112 may be electrically coupled to the memory cell array 110 to perform a data access operation, for example, a read operation or a write operation, according to a command set (including commands CMD, XADD, and YADD) output from an external source, for example, a memory controller (not shown). According to one embodiment, the memory control circuit 112 may be electrically coupled to the memory cell array 110 to perform a program operation (or a write operation), a read operation, or an erase operation.

The memory control circuit 112 may include a control logic 120, a voltage generator 130, a row decoder 140, a column decoder 150, a write driver & sense amplifier (S/A) block 160, an input/output (I/O) block 170, a fuse device 180, and a mode register set (MRS) unit 190.

The control logic 120 may control an overall operation of the memory control circuit 112 according to each command included in the command set (for example, the command CMD).

The voltage generator 130 may generate a voltage necessary for the data access operation, according to a control code generated by the control logic 120. Although the voltage generated by the voltage generator 130 is described as being supplied to the row decoder 140 for convenience of explanation, the disclosure is not limited thereto.

The row decoder 140 may decode a row address XADD in response to a control signal CTRr received from the control logic 120, and the row decoder 140 may generate a plurality of word line signals provided to corresponding word lines. The column decoder 150 may decode a column address YADD in response to a control signal CTRc received from the control logic 120, and the column decoder 150 may generate a plurality of column selection signal to select one or more bit lines among the plurality of bit lines.

When the memory device 100 performs a read operation, the write driver & S/A block 160 may operate as a sense amplifier capable of sensing and amplifying a voltage level of each of a plurality of bit lines included in the memory cell array 110 in response to a control signal CTRs received from the control logic 120. When the memory device 100 performs a write operation, the write driver & S/A block 160 may operate as a write driver capable of driving each of the bit lines included in the memory cell array 110 in response to a control signal CTRs received from the control logic 120.

The I/O block 170 may transmit data DATA received from outside the memory device 100 (e.g., at an external terminal of the memory device 100) to the column decoder 150 or transmit the data DATA output from the column decoder 150 to the outside of the memory device 100 (e.g., via the external terminal), for example, to the memory controller (not shown).

Figure 2A:
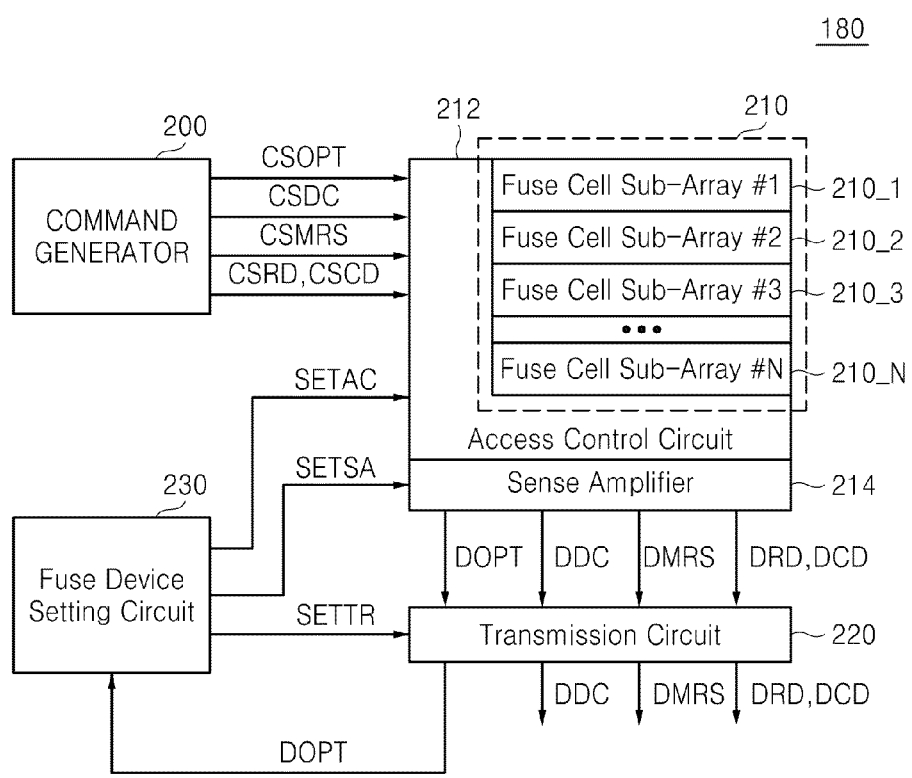
FIG. 2A is a block diagram of a fuse device illustrated in FIG. 1 according to one embodiment.

The fuse device 180 may store data associated with operation conditions of the fuse device 180, for example, option data DOPT of FIG. 2A. The option data DOPT of FIG. 2A will be described later in detail with reference to FIG. 2A. Although the fuse device 180 is illustrated herein for convenience of explanation, an anti-fuse device may be used instead of the fuse device 180.

The fuse device 180 may store trimming data DDC associated with trimming level of a voltage or current necessary for an operation of the memory device 100. According to one embodiment, the trimming data DDC may include information about a level of a voltage required by the voltage generator 130 to trim the voltage or a level of a current required by the voltage generator 130 to trim the current.

The fuse device 180 may store defective cell address data associated with one or more defective cells included in the memory cell array 100, for example, row data DRD including a row address of the defective cells or column data DCD including a column address of the defective cells.

The fuse device 180 may store MRS data DMRS associated with setting of the MRS unit 190. According to an embodiment, the MRS data DMRS may include information required by the memory device 100 to operate according to an operation mode of the memory device 100, for example, an operational frequency, a DC voltage level, and the like.

The trimming data DDC read from the fuse device 180 may be transmitted to the voltage generator 130, and the voltage generator 130 may generate a voltage based on the trimming data DDC.

The row data DRD read from the fuse device 180 may be transmitted to the row decoder 140, and the row decoder 140 may decode the row address XADD based on the row data DRD. According to one embodiment, when the row address XADD is identical to a row address of a defective cell of the memory cell array 110, the row decoder 140 may remap the row address XADD to a row address of a redundancy cell corresponding to the defective cell.

The column data DCD read from the fuse device 180 may be transmitted to the column decoder 150, and the column decoder 150 may decode the column address YADD based on the column data DCD. According to one embodiment, when the column address YADD is identical to a column address of a defective cell of the memory cell array 110, the column decoder 150 may remap the column address YADD to a column address of a redundancy cell corresponding to the defective cell.

The MRS data DMRS read from the fuse device 180 may be transmitted to the MRS unit 190.

Although the fuse device 180 is installed as a separate component within the memory device 100 in FIG. 1 for convenience of explanation, the fuse device 180 may be included in each component (for example, the memory cell array 110) of the memory device 100.

A structure and an operation of the fuse device 180 will be described later in detail with reference to FIG. 2A.

The MRS unit 190 may include a mode register (not shown). The MRS unit 190 may set the mode register included in the MRS unit 190, based on the MRS data DMRS read from the fuse device 180. The MRS unit 190 may transmit a mode signal SMODE to the control logic 120, and the control logic 120 may control an overall operation of the memory device 100 based on the mode signal SMODE.

FIG. 2A is a block diagram of the fuse device 180 of FIG. 1 according to one embodiment. Referring to FIGS. 1 and 2, the fuse device 180 may include a command generator 200, a fuse cell array 210, an access control circuit 212, and a sense amplifier 214. The fuse device 180 may further include a transmission circuit 220 and a fuse device setting circuit 230. A number of circuits of the fuse device 180 (e.g., a command generator 200, an access control circuit 212, a sense amplifier 214, a transmission circuit 220, and a fuse device setting circuit 230) may store and read data into/from the fuse cell array 210. The circuits may be referred to herein as a fuse control circuit.

The command generator 200 may output a plurality of command sets CSOPT, CSDC, CSMRS, CSRD, and CSCD. Each of the command sets CSOPT, CSDC, CSMRS, CSRD, and CSCD may denote a signal including a command and/or an address. The command generator 200 may sequentially transmit the command sets CSOPT, CSDC, CSMRS, CSRD, and CSCD to the access control circuit 212. Transmission timing of the command sets CSOPT, CSDC, CSMRS, CSRD, and CSCD will be described later in detail with reference to FIG. 4.

The fuse cell array 210 may include a plurality of fuse cell sub-arrays 210_1 through 210_N. Each of the plurality of fuse cell sub-arrays 210_1 through 210_N may include a plurality of fuse cells or a plurality of anti-fuse cells to store data. Each of the plurality of fuse cells and anti-fuse cells may be connected to one of a plurality of word lines and one of a plurality of bit lines. A structure of the fuse cell sub-array will be described later in detail with reference to FIG. 2B. In one embodiment, the word lines and bit lines of the fuse cell array 210 are different from the word lines and bit lines of the memory cell array 110.

According to one embodiment, the first fuse cell sub-array 210_1 may store the option data DOPT, a second fuse cell sub-array 210_2 may store the trimming data DDC, a third fuse cell sub-array 210_3 may store the MRS data DMRS, and the N-th fuse cell sub-array 210_N may store the row data DRD and the column data DCD.

The option data DOPT may denote data associated with operation conditions of the fuse device 180. According to one embodiment, the option data DOPT may include information associated with an operation of the access control circuit 212 reading data from the fuse cell array 210, for example, an operational frequency, a DC voltage level, and the like. According to another embodiment, the option data DOPT may include information associated with a sensing operation and an amplifying operation of the sense amplifier 214, for example, a sensing voltage and the like. According to another embodiment, the option data DOPT may include information associated with transmission of the transmission circuit 220, for example, a timing margin during data transmission of the transmission circuit 220.

In other words, the fuse cell array 210 may include both a fuse cell sub-array that stores the data (for example, the option data DOPT) associated with the operation conditions of the fuse device 180, for example, the first fuse cell sub-array 210_1, and fuse cell sub-arrays that store data (for example, the trimming data DDC, the MRS data DMRS, the row data DRD, or the column data DCD) associated with operation conditions of the memory device 100, for example, the second through N-th fuse cell sub-arrays 210_2 through 210_N.

The number of fuse cell sub-arrays included in the fuse cell array 210 may be at least 2, so the disclosure is not limited to the first through N-th fuse cell sub-arrays 210_1 through 210_N.

In one embodiment, each of bit lines of each of the fuse cell sub-arrays may be shared when the first through N-th fuse cell sub-arrays 210_1 through 210_N are arranged in a column direction and are directly adjacent to each other. In another embodiment, each of word lines of each of the fuse cell sub-arrays may be shared when the first through N-th fuse cell sub-arrays 210_1 through 210_N are arranged in a row direction and are directly adjacent to each other.

The access control circuit 212 may access data from the fuse cell array 210 in response to the command set CSOPT, CSDC, CSMRS, CSRD, or CSCD received from the command generator 200. According to one embodiment, the access control circuit 212 may include a control logic (not shown), a voltage generator (not shown), a row decoder (not shown), and/or a column decoder (not shown).

The sense amplifier 214 may sense and amplify a voltage level of each of a plurality of bit lines included in the fuse cell array 210, according to an access operation of the access control circuit 212. According to one embodiment, the sense amplifier 214 may output the option data DOPT stored in the first fuse cell sub-array 210_1, according to an access operation of the access control circuit 212 performed based on the command set CSOPT.

According to another embodiment, the sense amplifier 214 may output the trimming data DDC stored in the second fuse cell sub-array 210_2, according to an access operation of the access control circuit 212 performed based on the command set CSDC. According to another embodiment, the sense amplifier 214 may output the MRS data DMRS stored in the third fuse cell sub-array 210_3, according to an access operation of the access control circuit 212 performed based on the command set CSMRS. According to another embodiment, the sense amplifier 214 may output the row data DRD and the column data DCD stored in the N-th fuse cell sub-array 210_N, according to an access operation of the access control circuit 212 performed based on the command sets CSRD and CSCD.

According to one embodiment, when the fuse device 180 does not include the transmission circuit 220, the option data DOPT, the trimming data DDC, the MRS data DMRS, the row data DRD, and the column data DCD output from the sense amplifier 214 may be directly transmitted to the fuse device setting circuit 230, the voltage generator 130, the MRS unit 190, the row decoder 140, and the column decoder 150, respectively.

The transmission circuit 220 may determine a transmission sequence of the option data DOPT, the trimming data DDC, the MRS data DMRS, the row data DRD, and the column data DCD output from the sense amplifier 214, and the option data DOPT, the trimming data DDC, the MRS data DMRS, the row data DRD, and the column data DCD may be transmitted to the fuse device setting circuit 230, the voltage generator 130, the MRS unit 190, the row decoder 140, and the column decoder 150, respectively, in the determined transmission sequence.

A structure and an operation of the transmission circuit 220 will be described later in detail with reference to FIG. 6, and the transmission sequence of the option data DOPT, the trimming data DDC, the MRS data DMRS, the row data DRD, and the column data DCD will be described later in detail with reference to FIGS. 5 and 7.

The fuse device setting circuit 230 may set the operation conditions of the fuse device 180, based on the option data DOPT received from the transmission circuit 220. According to one embodiment, the fuse device setting circuit 230 may generate a setting signal SETAC for setting operation conditions associated with an operation of the access control circuit 212 accessing data from the fuse cell array 210, and may transmit the setting signal SETAC to the access control circuit 212, based on the option data DOPT.

According to another embodiment, the fuse device setting circuit 230 may generate a setting signal SETSA for setting operation conditions associated with a sensing operation and an amplifying operation of the sense amplifier 214, and may transmit the setting signal SETSA to the sense amplifier 214, based on the option data DOPT. According to another embodiment, the fuse device setting circuit 230 may generate a setting signal SETTR for setting operation conditions associated with an operation of the transmission circuit 220 transmitting the option data DOPT, the trimming data DDC, the MRS data DMRS, the row data DRD, or the column data DCD, and may transmit the setting signal SETTR to the transmission circuit 220, based on the option data DOPT.

Figure 2B:
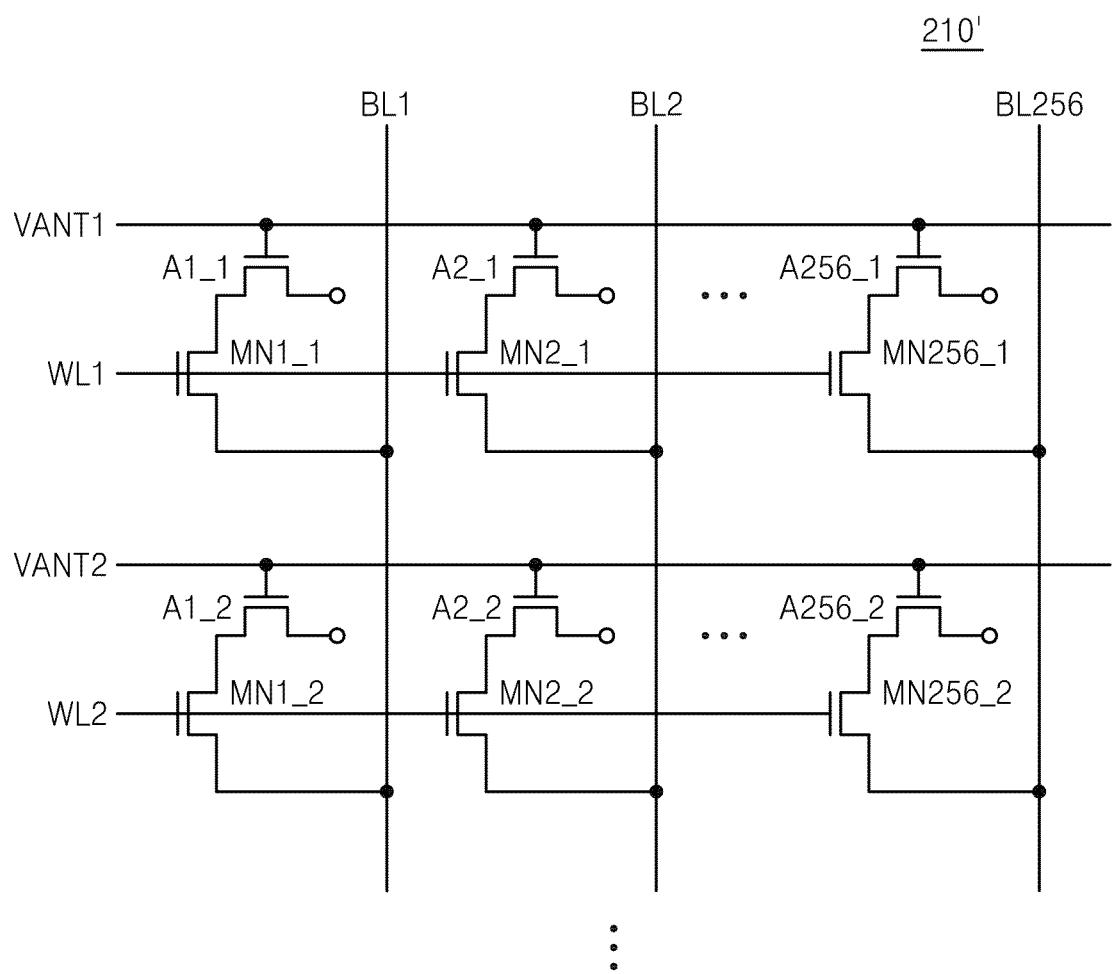
FIG. 2B is an exemplary circuit diagram illustrating each of fuse cell sub-arrays included in FIG. 2A, according to certain embodiments.

FIG. 2B is an exemplary circuit diagram illustrating each of fuse cell sub-arrays included in FIG. 2A, according to certain embodiments.

Referring to FIG. 2B, although a plurality of anti-fuse cells are illustrated in FIG. 2B for convenience of explanation, the type of fuse cells included in each of the fuse cell sub-arrays is not limited as such. An anti-fuse cell sub-array 210' may include anti-fuse cells A1_1 to A256_1 and selection transistors MN1_1 to MN256_1 connected in series to the anti-fuse cells A1_1 to A256_1, respectively. Also, the anti-fuse cell sub-array 210' may include anti-fuse cells A1_2 to A256_2 and selection transistors MN1_2 to MN256_2 connected in series to the anti-fuse cells A1_2 to A256_2, respectively.

An anti-fusing voltage VANT1 may be applied to gates of the respective anti-fuse cells A1_1 to A256_1, and sources of the respective anti-fuse cells A1_1 to A256_1 may be floated. The selection transistors MN1_1 to MN256_1 may have drains, which are electrically connected to drains of the anti-fuse cells A1_1 to A256_1, respectively, and gates to which a word line drive signal corresponding to a word line WL1 of FIG. 1 is applied. Sources of the selection transistors MN1_1 to MN256_1 may be electrically connected to bit lines BL1 to BL256, respectively. The anti-fusing voltage VANT1 and the word line drive signal may be generated from the row decoder 140 of FIG. 1.

An anti-fuse voltage VANT2 may be applied to gates of the respective anti-fuse cells A1_2 to A256_2, and sources of the respective anti-fuse cells A1_2 to A256_2 may be floated. The selection transistors MN1_2 to MN256_2 may have drains, which are electrically connected to drains of the anti-fuse cells A1_2 to A256_2, respectively, and gates to which a word line drive signal corresponding to a word line WL2 of FIG. 1 is applied. Sources of the selection transistors MN1_2 to MN256_2 may be electrically connected to the bit lines BL1 to BL256, respectively. The anti-fusing voltage VANT2 and the word line drive signal may be generated from the row decoder 140 of FIG. 1.

Hereinafter, operation of the anti-fuse cell array 210' will be described.

When the anti-fuse A1_1 is programmed, a high voltage of, for example, about 6 V may be applied as an anti-fusing voltage VANT1 to the gates of the anti-fuse cells A1_1 to A256_1. A voltage VANT1/2 of, for example, about 3 V may be applied to the gate of the selection transistor MN1_1 connected to the drain of the anti-fuse A1_1 to turn on the selection transistor MN1_1. A low electric potential of, for example, 0 V may be applied to the bit line BL1 electrically connected to the source of the selection transistor MN1_1. Under this condition, a thin gate oxide layer of the anti-fuse A1_1 may be broken to form an ohmic contact between a gate electrode and the drain. Thus, a current path may lead from a gate electrode of the anti-fuse A1_1 to the bit line BL1. In this case, a voltage VANT1/2 of, for example, about 3 V may be applied to bit lines electrically connected to unselected cells such that a high voltage is not applied to both ends of the gate oxide layer of the anti-fuse A1_1. Also, a low voltage of, for example, 0 V may be applied to gates of the anti-fuse cells A1_2 to A256_2 to be unprogrammed so that unselected anti-fuse cells may not be programmed.

Figure 3:
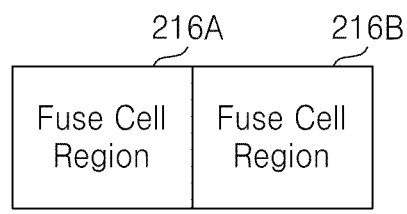
FIG. 3 is a block diagram of a first fuse cell sub-array illustrated in FIG. 2A, according to one embodiment.

FIG. 3 is a block diagram of the first fuse cell sub-array 210_1 illustrated in FIG. 2A according to one embodiment. Referring to FIGS. 1 through 3, the first fuse cell sub-array 210_1 may include a plurality of fuse cell regions 216A and 216B.

The fuse cell regions 216A and 216B may store different types of option data DOPT.

According to one embodiment, the fuse cell region 216A may store option data associated with an operation of the access control circuit 212 accessing data from the fuse cell array 210, and the fuse cell region 216B may store option data associated with a sensing operation and an amplifying operation of the sense amplifier 214. According to another embodiment, the fuse cell region 216A may store option data associated with trimming of a voltage or current necessary for an operation of the fuse device 180, and the fuse cell region 216B may store option data associated with an operation mode of the fuse device 180.

Although the two fuse cell regions 216A and 216B are illustrated in FIG. 3 for convenience of explanation, the number of fuse cell regions included in the first fuse cell sub-array 210_1 is not limited to.

Figure 4:
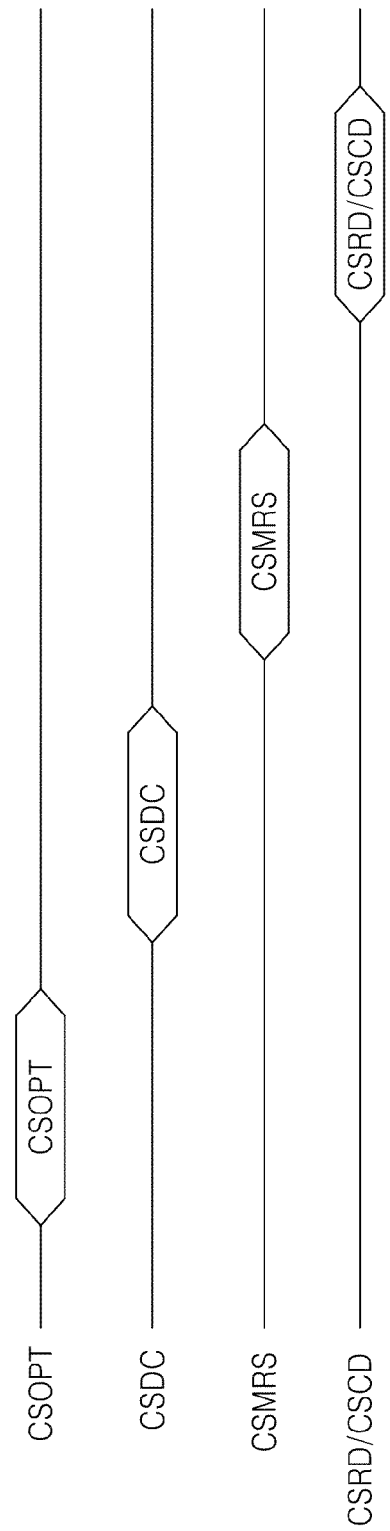
FIG. 4 is a timing diagram of a plurality of command sets transmitted by a command generator illustrated in FIG. 2A, according to certain embodiments.

FIG. 4 is a timing diagram of the command sets CSOPT, CSDC, CSMRS, CSRD, and CSCD transmitted by the command generator 200 illustrated in FIG. 2A according to certain embodiments. Referring to FIGS. 2 and 4, the command generator 200 may transmit the command set CSOPT for reading the option data DOPT to the access control circuit 212, earlier than the other command sets CSDC, CSMRS, CSRD, and CSCD.

Referring to FIG. 4, the command generator 200 may sequentially transmit the command set CSOPT for reading the option data DOPT, the command set CSDC for reading the trimming data DDC, the command set CSMRS for reading the MRS data DMRS, and the command sets CSRD and CSCD for reading defective cell address data DRD and DCD, namely, the row data DRD and the column data DCD.

According to one embodiment, the sequence of transmitting the command sets CSOPT, CSDC, CSMRS, CSRD, and CSCD may change, and is not limited to the sequence illustrated in FIG. 4.

Figure 5:
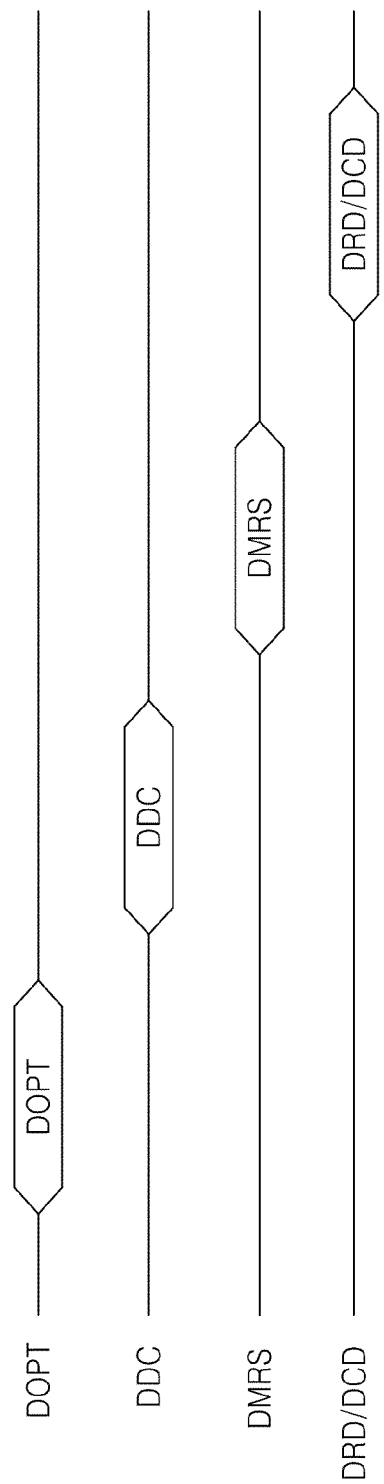
FIG. 5 is a timing diagram of a plurality of parallel data illustrated in FIG. 2A, according to certain embodiments.

FIG. 5 is a timing diagram of a plurality of parallel data, namely, the option data DOPT, the trimming data DDC, the MRS data DMRS, and the defective cell address data DRD and DCD illustrated in FIG. 2A according to certain embodiments. Referring to FIGS. 2 and 5, the option data DOPT, the trimming data DDC, the MRS data DMRS, and the defective cell address data DRD and DCD may be sequentially output from the sense amplifier 214.

According to one embodiment, when the fuse device 180 includes the transmission circuit 220, the option data DOPT, the trimming data DDC, the MRS data DMRS, and the defective cell address data DRD and DCD may be sequentially output from the transmission circuit 220. The sequence of transmitting the data DOPT, DDC, DMRS, DRD, and DCD may change, and is not limited to the sequence illustrated in FIG. 5.

Figure 6:
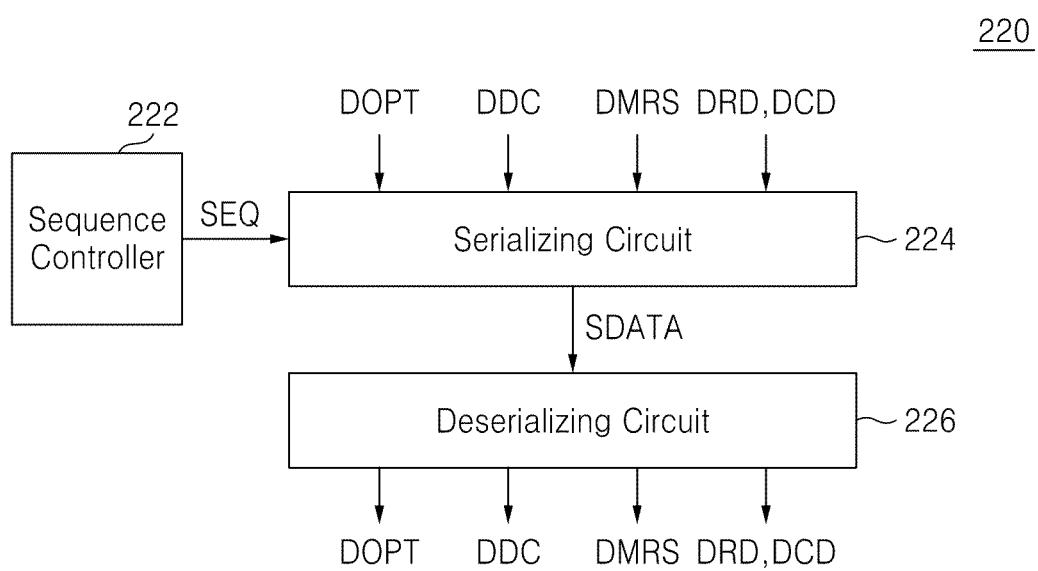
FIG. 6 is a block diagram of a transmission circuit illustrated in FIG. 2A, according to one embodiment.
Figure 7:
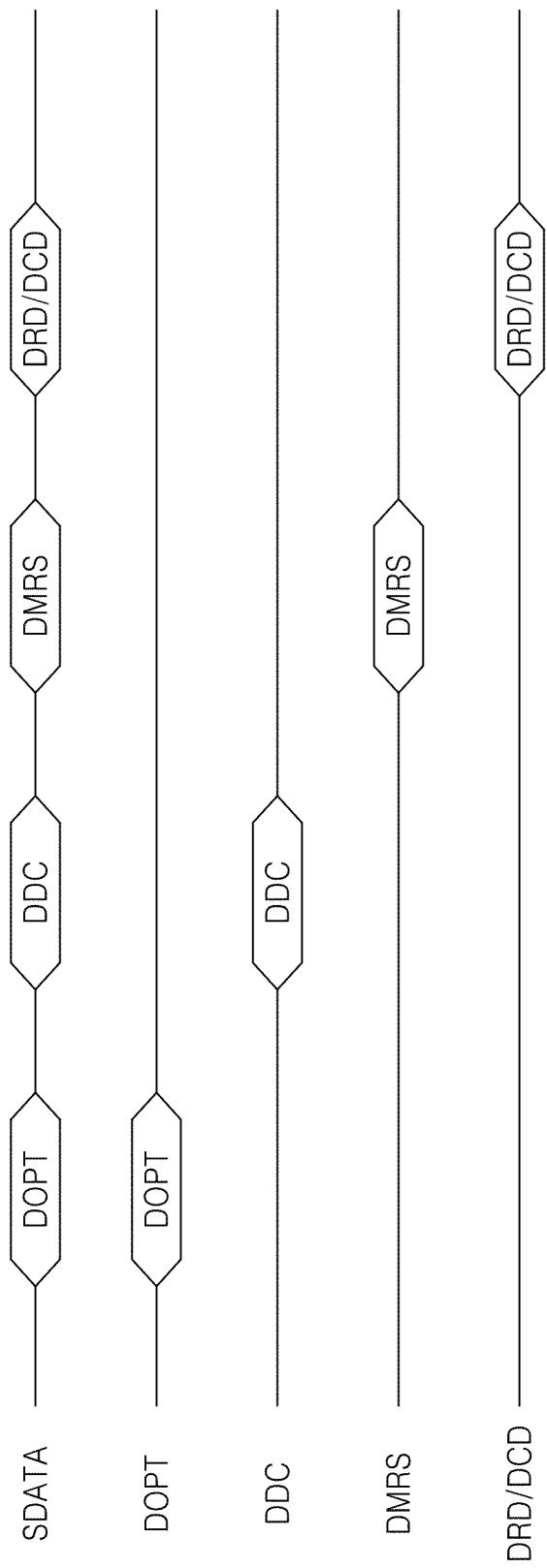
FIG. 7 is a timing diagram of serial data and a plurality of parallel data illustrated in FIG. 6, according to certain embodiments.

FIG. 6 is a block diagram of the transmission circuit 220 illustrated in FIG. 2A according to one embodiment, and FIG. 7 is a timing diagram of serial data SDATA and the parallel data DOPT, DDC, DMRS, DRD, and DCD illustrated in FIG. 6 according to certain embodiments. Referring to FIGS. 2, 6, and 7, the transmission circuit 220 may include a sequence controller 222, a serializing circuit 224, and a deserializing circuit 226.

According to one embodiment, the serializing circuit 224 may include a data buffer (not shown). The serializing circuit 224 may output the serial data SDATA by serializing the data received from the access control circuit 212, for example, the option data DOPT, the trimming data DDC, the MRS data DMRS, the row data DRD, and the column data DCD, in response to a sequence signal SEQ output from the sequence controller 222.

For example, the serializing circuit 224 may output the serial data SDATA by serializing the option data DOPT, the trimming data DDC, the MRS data DMRS, the row data DRD, and the column data DCD according to predetermined order.

The deserializing circuit 226 may output the parallel data, for example, the option data DOPT, the trimming data DDC, the MRS data DMRS, the row data DRD, and/or the column data DCD, by deserializing the serial data SDATA received from the serializing circuit 224. In this case, the option data DOPT may be output from the transmission circuit 220 earlier than the trimming data DDC, the MRS data DMRS, the row data DRD, and/or the column data DCD, through serialization and deserialization.

Figure 8:
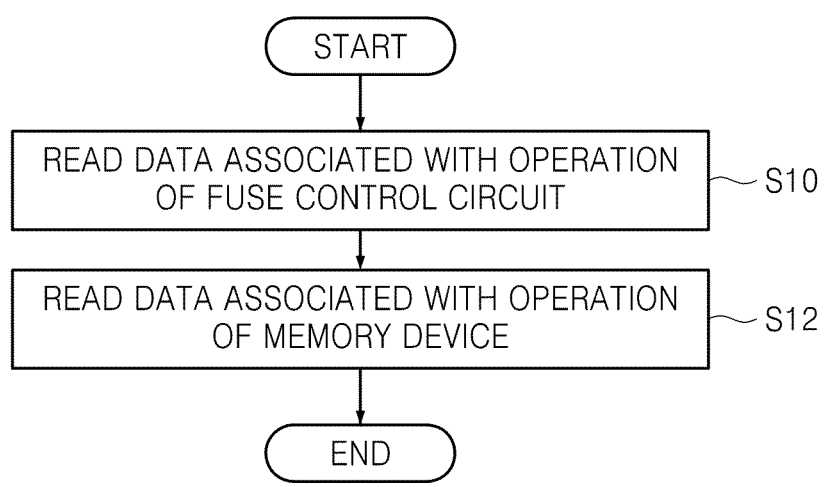
FIG. 8 is an exemplary flowchart of a method for reading data from the fuse cell array 210 of FIG. 2A, according to one embodiment.

FIG. 8 is an exemplary flowchart of a method for reading data from the fuse cell array of FIG. 2A, according to one embodiment. Referring to FIGS. 1, 2, and 8, first data (e.g., the option data DOPT) associated with the operation of the fuse control circuit (e.g., the access control circuit 212, the sense amplifier 214, and the transmission circuit, etc.) of the fuse device 180 may be read from a fuse cell sub-array, for example, the first fuse cell sub-array 210_1, based on a command set (for example, the command set CSOPT) transmitted from the command generator 200, in operation S10.

In operation S12, second data (e.g., the trimming data DDC, the MRS data DMRS, the row data DRD, or the column data DCD) associated with the operation of the memory device 100 may be read from fuse cell sub-arrays, for example, one of the second through N-th fuse cell sub-arrays 210_2 through 210_N, based on a command set (for example, the command set CSDC, CSMRS, CSRD, or CSCD) transmitted by the command generator 200.

According to one embodiment, after data associated with the operation of the fuse control circuit is read, data associated with the operation of the memory cell array may be read. According to another embodiment, the sequence of the operations S10 and S12 may be reversed.

Figure 9:
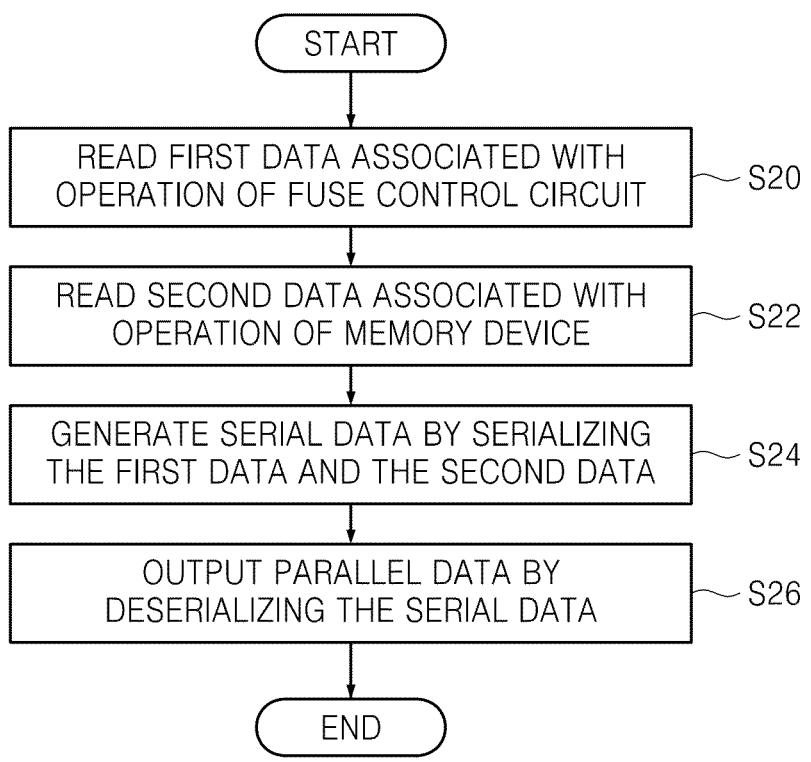
FIG. 9 is an exemplary flowchart of a method for reading data from a fuse device, according to another embodiment.

FIG. 9 is an exemplary flowchart of a method for reading data from the fuse cell array of FIG. 2A, according to another embodiment. Referring to FIGS. 1, 2, and 6-9, since operations S20 and S22 of FIG. 9 are substantially the same as the operations S10 and S12 of FIG. 8, a description thereof will be omitted.

In operation S24, the serializing circuit 224 may generate the serial data SDATA by serializing the first data (for example, the option data DOPT) read from the sense amplifier 214 and the second data (for example, the trimming data DDC, the MRS data DMRS, the row data DRD, and/or the column data DCD) read from the sense amplifier 214. The serial data SDATA may be transmitted to the deserializing circuit 226.

In operation S26, the deserializing circuit 226 may output the parallel data, for example, the option data DOPT, the trimming data DDC, the MRS data DMRS, the row data DRD, and the column data DCD, by deserializing the serial data SDATA received from the serializing circuit 224.

Figure 10:
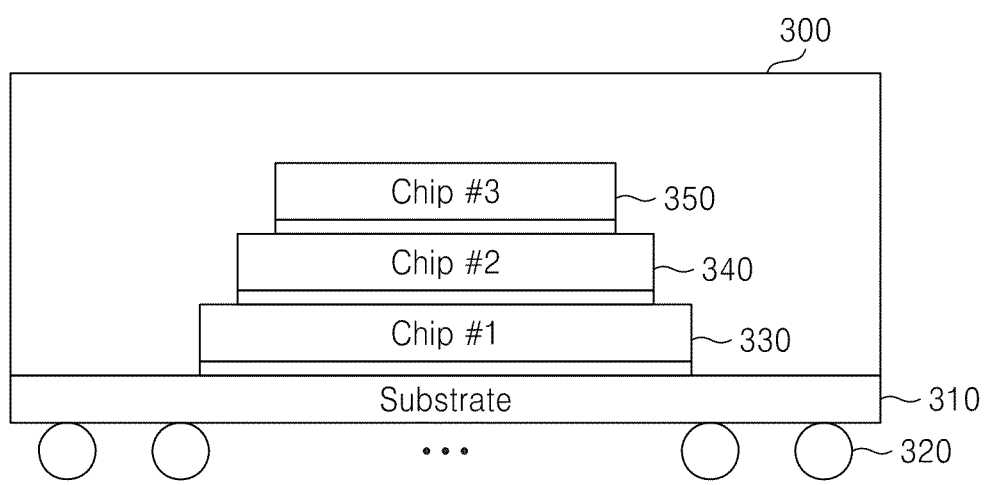
FIG. 10 is a diagram illustrating a package including the memory device illustrated in FIG. 1, according to certain embodiments.

FIG. 10 is a diagram illustrating a package 300 including the memory device 100 illustrated in FIG. 1, according to certain embodiments. Referring to FIGS. 1 and 10, the package 300 may include a plurality of semiconductor devices 330, 340, and 350 sequentially stacked on a package substrate 310. In one embodiment, at least one of the semiconductor devices 330, 340, and 350 may be the memory device 100 of FIG. 1. In another embodiment, at least one of the semiconductor devices 330, 340, and 350 may be a memory controller.

The package 300 may be implemented by using a Package On Package (PoP), Ball Grid Arrays (BGAs), Chip Scale Packages (CSPs), a Plastic Leaded Chip Carrier (PLCC), a Plastic Dual In-Line Package (PDIP), a Chip On Board (COB), a CERamic Dual In-Line Package (CERDIP), a plastic metric quad flat pack (MQFP), a Thin Quad Flat Pack (TQFP), a small-outline integrated circuit (SOIC), a shrink small outline package (SSOP), a thin small outline package (TSOP), a system in package (SIP), a multi chip package (MCP), a wafer-level package (WLP), or a wafer-level processed stack package (WSP).

According to one embodiment, the memory controller (not shown) may be implemented within at least one of the semiconductor devices 330, 340, and 350 or may be implemented on the package substrate 310. Electrical vertical connection means, for example, a through-substrate via (TSV, e.g., through-silicon via), may be used to form an electrical connection between the semiconductor devices 330, 340, and 350.

The package 300 may be implemented by using a Hybrid Memory Cube (HMC) with a stacked structure of a memory controller and a memory device. The implementation by using the HMC may improve the performance of a memory device due to an increase in bandwidth and minimize an area occupied by the memory device, thereby reducing power consumption and production costs.

Figure 11:
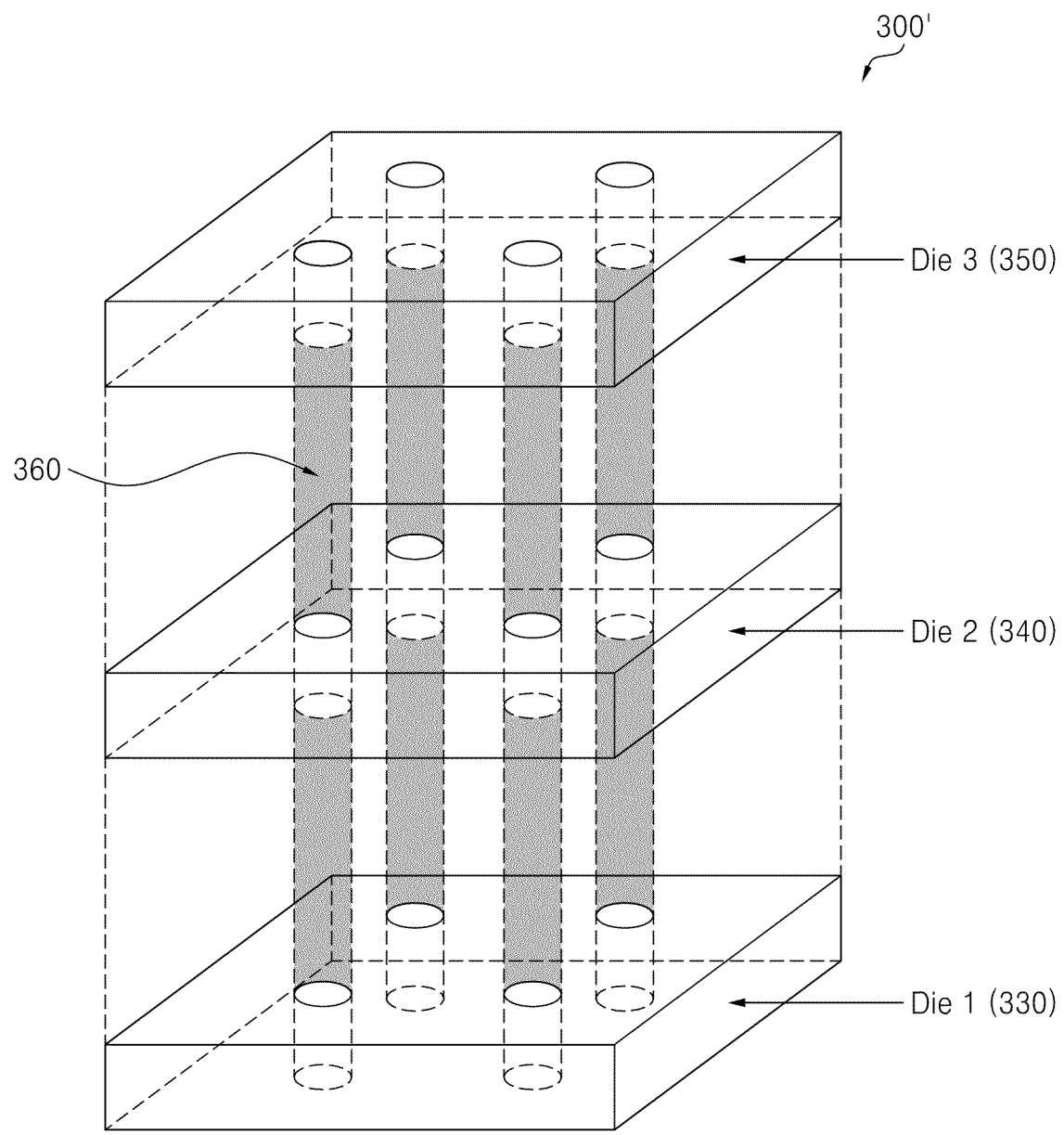
FIG. 11 is a diagram three-dimensionally illustrating a package including the memory device illustrated in FIG. 1, according to certain embodiments.

FIG. 11 is a diagram three-dimensionally illustrating a package 300' including a memory device such as discussed above, for example, the memory device 100 illustrated in FIG. 1, according to certain embodiments. Referring to FIGS. 1, 10, and 11, the package 300' includes a plurality of dies 330, 340, and 350, which are sequentially stacked one on another and connected to one another via TSVs 360. In one embodiment, at least one of the plurality of dies 330, 340, and 350 may be the memory device 100 of FIG. 1. In another embodiment, at least one of the plurality of dies 330, 340, and 350 may be the memory controller.

Figure 12:
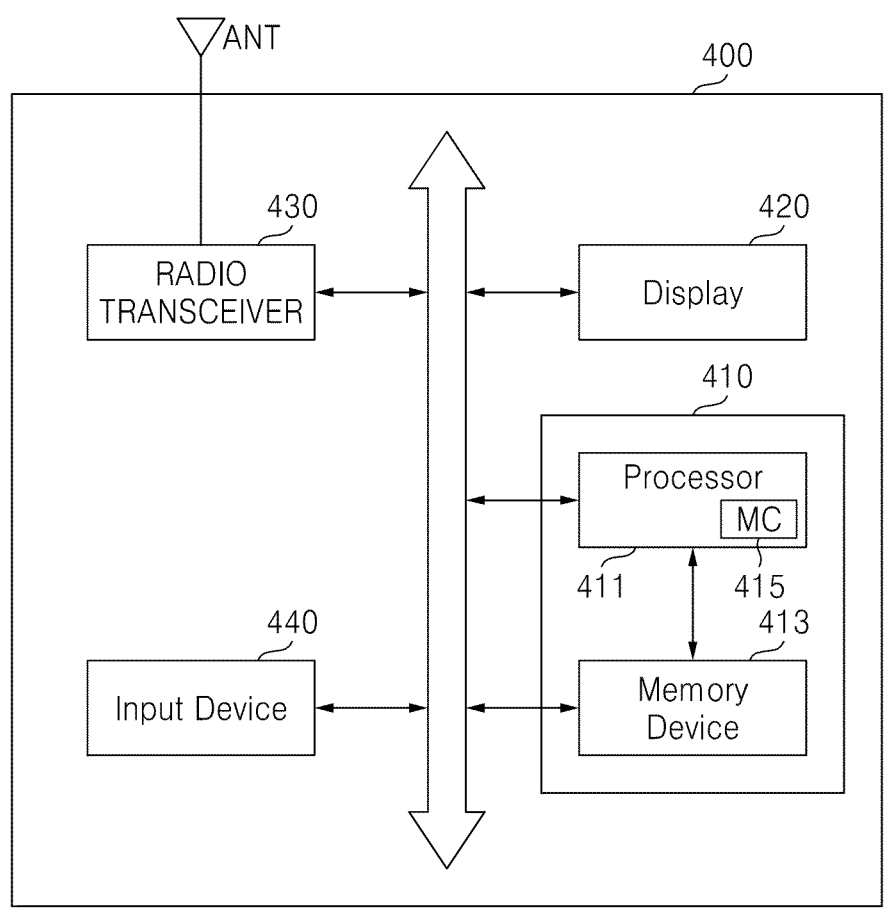
FIG. 12 is an exemplary block diagram of a system including the memory device illustrated in FIG. 1, according to one embodiment.

FIG. 12 is an exemplary block diagram of a system 400 including a memory device such as discussed above, for example, the memory device 100 illustrated in FIG. 1, according to one embodiment. Referring to FIGS. 1 and 10-12, the system 400 may be implemented by using an electronic device or a portable device. Examples of the portable device may include a cellular phone, a smart phone, and a tablet personal computer (PC).

The system 400 includes a processor 411 and a memory device 413. The memory device 413 may be the memory device 100 of FIG. 1. The processor 411 and the memory device 413 may be packaged into a package 410. In this case, the package 410 may be mounted on a system board (not shown). The package 410 may be the package 300 of FIG. 10 or the package 300' of FIG. 11.

The processor 411 includes a memory controller 415 capable of controlling a data processing operation, for example, a write operation or a read operation, of the memory device 413. The memory controller 415 is controlled by the processor 411 controlling the entire operation of the system 400. According to one embodiment, the memory controller 415 may be connected between the processor 411 and the memory device 413.

The data stored in the memory device 413 may be displayed on a display 420 under the control of the processor 411.

A radio transceiver 430 may transmit or receive a radio signal via an antenna ANT. For example, the radio transceiver 430 may change a radio signal received via the antenna ANT to a signal that can be processed by the processor 411. Accordingly, the processor 411 may process the signal output from the radio transceiver 430 and may store the processed signal in the memory device 413 or display the processed signal on the display 420. The radio transceiver 430 may also change a signal output from the processor 411 to a radio signal and may output the radio signal to the outside via the antenna ANT.

An input device 440 is capable of inputting a control signal for controlling an operation of the processor 411 or data which is to be processed by the processor 411, and may be implemented by using a keypad, a keyboard, or a pointing device such as a touch pad or a computer mouse.

The processor 411 may control the display 420 to display data output from the memory device 413, a radio signal output from the radio transceiver 430, or data output from the input device 440.

Figure 13:
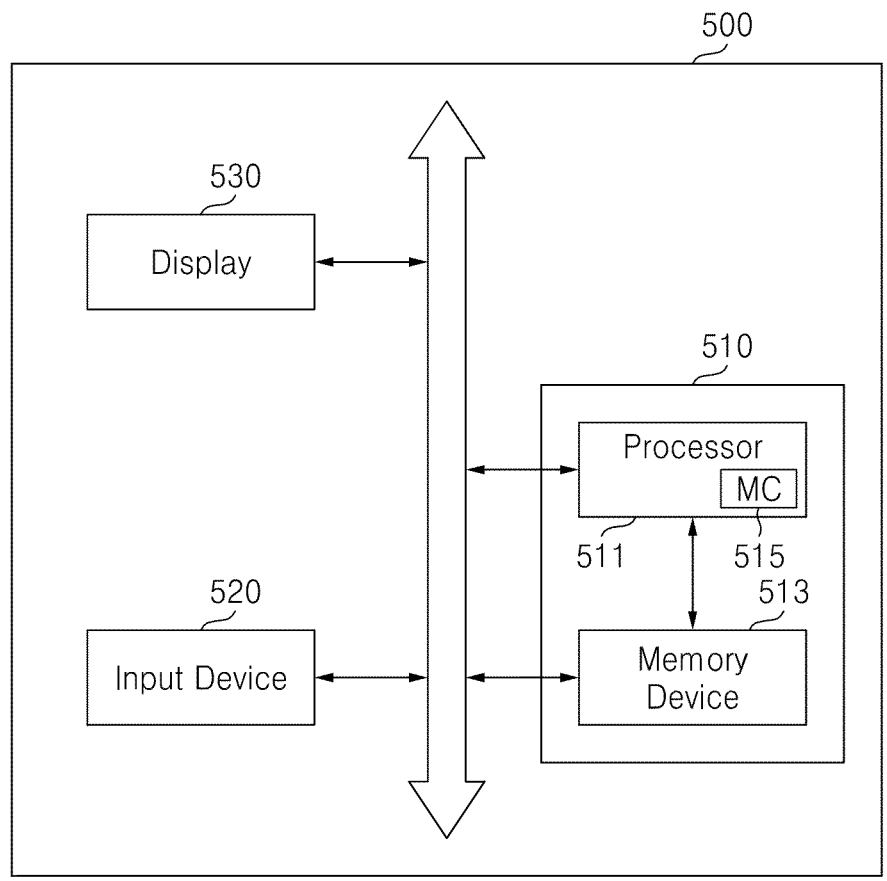
FIG. 13 is an exemplary block diagram of a system including the memory device illustrated in FIG. 1, according to another embodiment.

FIG. 13 is an exemplary block diagram of a system 500 including a memory device such as discussed above, for example, the memory device 100 illustrated in FIG. 1, according to another embodiment. Referring to FIGS. 1, 10, 11, and 13, the system 500 may be implemented by using a PC, a tablet PC, a net-book, an e-reader, a personal digital assistant (PDA), a portable multimedia player (PMP), an MP3 player, or an MP4 player.

The system 500 includes a processor 511 for controlling the entire operation of the system 500, and a memory device 513. The memory device 513 may be the memory device 100 of FIG. 1. The processor 511 and the memory device 513 may be packaged into a package 510. The package 510 may be mounted on a system board (not shown). The package 510 may be the package 300 of FIG. 10 or the package 300' of FIG. 11.

The processor 511 may include a memory controller 515 which controls an operation of the memory device 513. The processor 511 may display the data stored in the memory device 513 on a display 530 according to an input signal generated by an input device 520. For example, the input device 520 may be implemented by using a keypad, a keyboard, or a pointing device such as a touch pad or a computer mouse.

Figure 14:
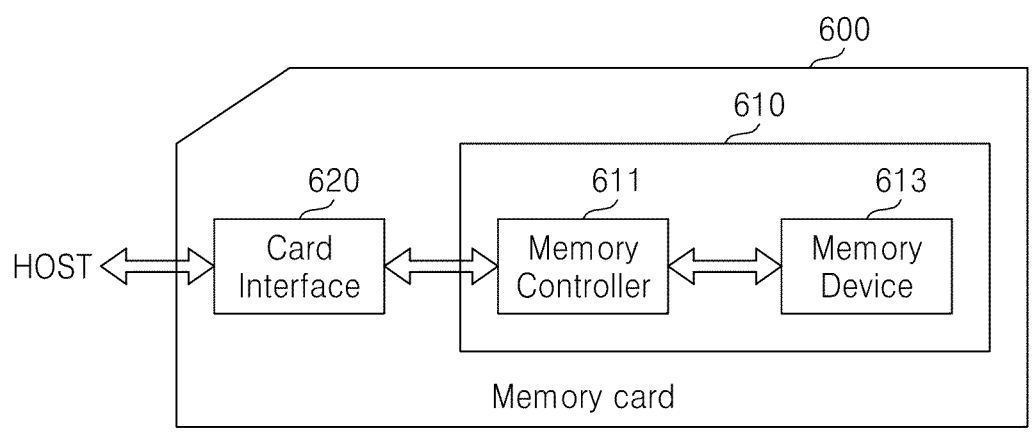
FIG. 14 is an exemplary block diagram of a system including the memory device illustrated in FIG. 1, according to further another embodiment.

FIG. 14 is an exemplary block diagram of a system 600 including a memory device such as discussed above, for example, the memory device 100 illustrated in FIG. 1, according to another embodiment. Referring to FIGS. 1, 10, 11, and 14, the system 600 may be implemented by using a memory card or a smart card.

The system 600 includes a memory device 613, a memory controller 611, and a card interface 620. The memory device 613 may denote the memory device 100 of FIG. 1. The memory device 613 and the memory controller 611 may be packaged into a package 610. The package 610 may be mounted on a system board (not shown). The package 610 may be the package 300 of FIG. 10 or the package 300' of FIG. 11.

The memory controller 611 may control data exchange between the memory device 613 and the card interface 620. According to an embodiment, the card interface 620 may be a secure digital (SD) card interface or a multi-media card (MMC) interface, but the inventive concept is not limited thereto.

The card interface 620 may interface data exchange between a host and the memory controller 611, according to the protocol of the host.

When the system 600 is connected to a host such as a computer, a digital camera, a digital audio player, a mobile phone, console video game hardware, or a digital set-top box, the host may transmit or receive the data stored in the memory device 613 via the card interface 620 and the memory controller 611.

Figure 15:
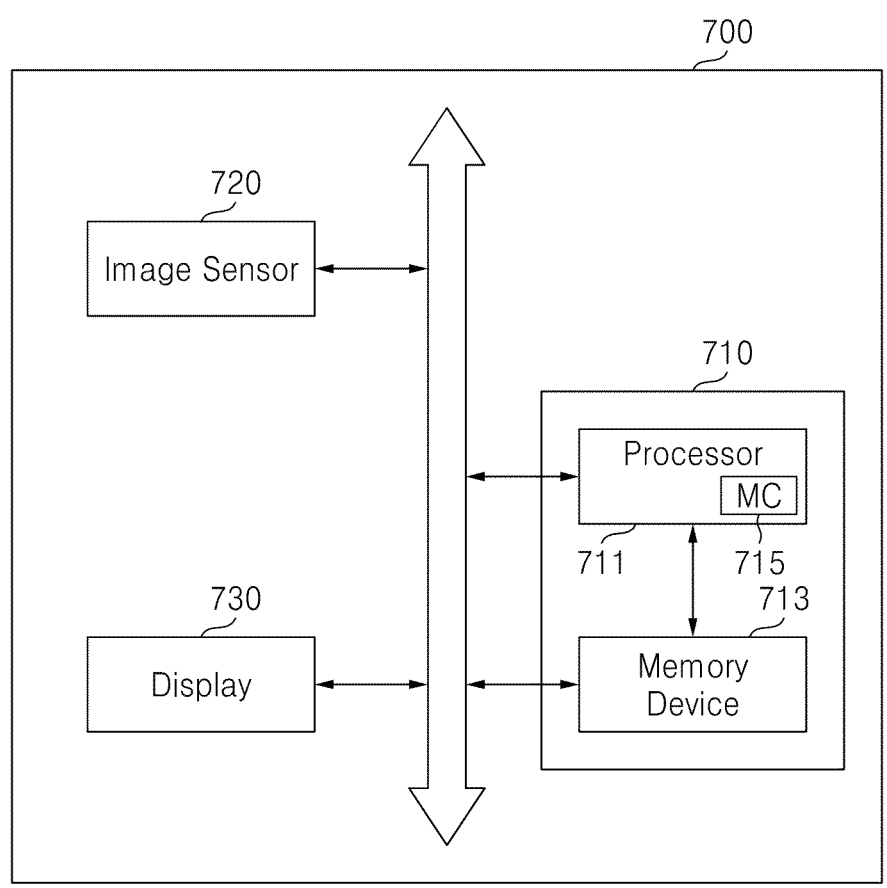
FIG. 15 is an exemplary block diagram of a system including the memory device illustrated in FIG. 1, according to still another embodiment.

FIG. 15 is an exemplary block diagram of a system 700 including a memory device such as discussed above, for example, the memory device 100 illustrated in FIG. 1, according to another embodiment. Referring to FIGS. 1, 10, 11, and 15, the system 700 may be implemented by using a digital camera or a portable device having a digital camera attached thereto.

The system 700 includes a processor 711 for controlling the entire operation of the system 700, and a memory device 713. The memory device 713 may be the memory device 100 of FIG. 1. The processor 711 and the memory device 713 may be packaged into a package 710. The package 710 may be mounted on a system board (not shown). The package 710 may be the package 300 of FIG. 10 or the package 300' of FIG. 11.

An image sensor 720 of the system 700 converts an optical image into a digital signal, and the digital signal is stored in the memory device 713 or displayed on a display 730 under the control of the processor 711. The digital signal stored in the memory device 713 may be displayed on the display 730 under the control of the processor 711.

Figure 16:
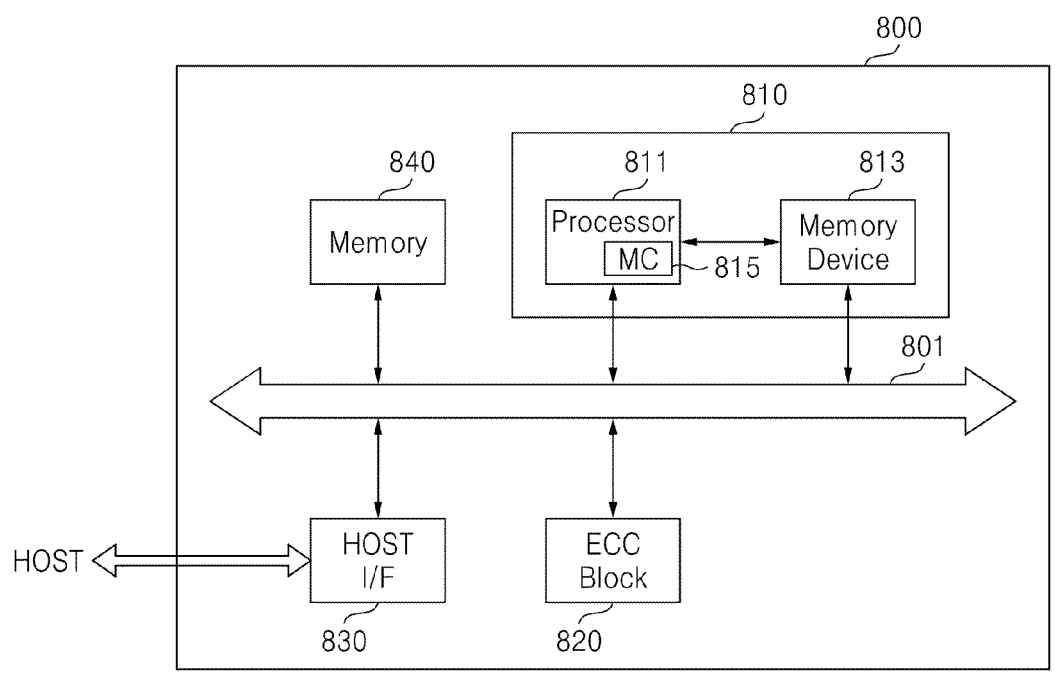
FIG. 16 is an exemplary block diagram of a system including the memory device illustrated in FIG. 1, according to still another embodiment.

FIG. 16 is an exemplary block diagram of a system 800 including a memory device such as discussed above, for example, the memory device 100 illustrated in FIG. 1, according to another embodiment. Referring to FIGS. 1, 10, 11, and 16, the system 800 includes a memory device 813 and a processor 811 capable of controlling the entire operation of the system 800. The memory device 813 may be the memory device 100 of FIG. 1.

The memory device 813 and the processor 811 may be packaged into a package 810. The package 810 may be mounted on a system board (not shown). The package 810 may be the package 300 of FIG. 10 or the package 300' of FIG. 11. The processor 811 may include a memory controller 815 which controls an operation of the memory device 813.

The system 800 includes a memory 840 capable of being used as an operation memory of the processor 811. The memory 840 may be implemented by using a non-volatile memory such as a read only memory (ROM) or a flash memory.

A host connected to the system 800 may transmit data to or receive the data from the memory device 813 via the processor 811 and a host interface 830. In this case, the memory controller 815 may operate as a memory interface.

The system 800 may further include an error correction code (ECC) block 820. The ECC block 820, which operates under the control of the processor 811, may detect and correct an error included in data read from the memory device 813 via the memory controller 815. The processor 811 may control data exchange between the ECC block 820, the host interface 830, and the memory 840 via a bus 801.

The system 800 may be implemented by using a Universal Serial Bus (USB) memory drive or a memory stick.

Figure 17:
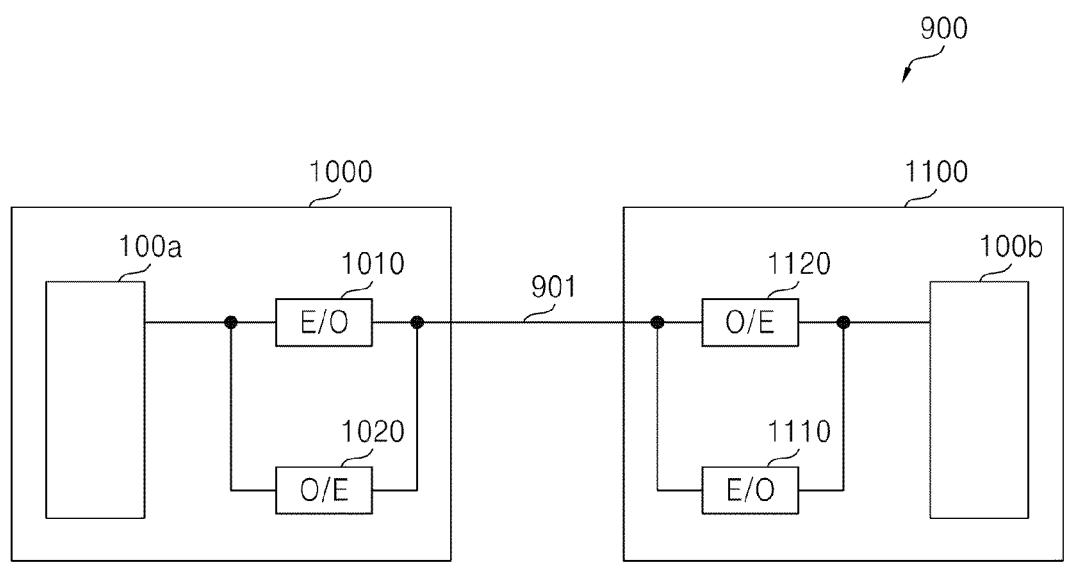
FIG. 17 is an exemplary block diagram of a system including the memory device illustrated in FIG. 1, according to still another embodiment.

FIG. 17 is an exemplary block diagram of a system 900 including a memory device such as discussed above, for example, the memory device 100 illustrated in FIG. 1, according to another embodiment. A channel 901 may denote optical connection means. The optical connection means may denote an optical fiber, an optical waveguide, or a medium that transmits an optical signal.

Referring to FIGS. 1 and 17, the system 900 may include a first system 1000 and a second system 1100.

The first system 1000 may include a first memory device 100a and an electrical-to-optical (E/O) conversion circuit 1010. The E/O conversion circuit 1010 may convert an electrical signal output from the first memory device 100a into an optical signal and may output the optical signal to the second system 1100 via the optical connection means 901. The second system 1100 includes an optical-to-electrical (O/E) conversion circuit 1120 and a second memory device 100b. The O/E conversion circuit 1120 may convert an optical signal received via the optical connection means 901 into an electrical signal and may transmit the electrical signal to the second memory device 100b.

The first system 1000 may further include an O/E conversion circuit 1020, and the second system 1100 may further include an E/O conversion circuit 1110.

When the second system 1100 transmits data to the first system 1000, the E/O conversion circuit 1110 may convert an electrical signal output from the second memory device 100*b* into an optical signal and may output the optical signal to the first system 1000 via the optical connection means 901. The O/E conversion circuit 1020 may convert an optical signal received via the optical connection means 901 into an electrical signal and may transmit the electrical signal to the first memory device 100*a*. A structure and an operation of each of the first and second memory devices 100*a* and 100*b* is substantially the same as those of the memory device 100 of FIG. 1.

A method and an apparatus according to an example embodiment of the present disclosure have efficient layout, by storing data associated with operation conditions of a fuse device and data associated with operation conditions of a memory device including the fuse device are stored in a single fuse cell array. Moreover, in the method and the device according to certain disclosed embodiments, the data associated with the operation conditions of the fuse device is first read and the data associated with the operation conditions of the memory device including the fuse device is then read, whereby the memory device may have an increased yield.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this disclosure as defined in the claims. In the claims, means-plus-function clauses are intended to cover the structures described herein as performing the recited function, and not only structural equivalents but also equivalent structures.

What is claimed is:

1. A memory device including a memory cell array, the memory device comprising:
   a fuse device including a fuse cell array and a fuse control circuit,
   wherein the fuse cell array comprises:
      a first fuse cell sub-array configured to store first data associated with operation of the fuse control circuit; and
      a second fuse cell sub-array configured to store second data associated with operation of the memory device,
   wherein the fuse control circuit is electrically coupled to the first and second fuse cell sub-arrays, and is configured to read the first and second data from the first and second fuse cell sub-arrays, respectively.

2. The memory device of claim 1, wherein the fuse control circuit comprises a fuse device setting circuit configured to set the operation conditions of the fuse device based on the first data read from the first fuse cell sub-array.

3. The memory device of claim 2, wherein the fuse control circuit further comprises:
   an access control circuit configured to select the first and second data from the first and second fuse cell array, respectively;
   a sense amplifier configured to sense and amplify the selected first and second data; and
   a transmission circuit configured to transmit the amplified first data to the fuse device setting circuit, and to transmit the amplified second data to the memory control circuit.

4. The memory device of claim 3, wherein the first data includes information associated with at least one of: operation of the access control circuit, operation of the sense amplifier, and operation of the transmission circuit.

5. The memory device of claim 3, wherein the transmission circuit includes:
   a sequence controller configured to generate a sequence signal;
   a serializing circuit configured to generate serial data by serializing the first data read from the first fuse cell sub-array and the second data read from the second fuse cell sub-array in response to the sequence signal; and
   a deserializing circuit configured to generate one or more parallel data by deserializing the serial data received from the serializing circuit.

6. The memory device of claim 1, wherein the second data includes information associated with at least one of a trimming level of voltage or current used for an operation of the memory device, an address of a defective cell of the memory cell array, and a mode register set MRS of the memory device.

7. The memory device of claim 1, further comprising:
   a memory control circuit configured to select one or more memory cells of the memory cell array, wherein the memory control circuit includes:
      a sense amplifier configured to sense data from the memory cell array, and to amplify the data;
      a row decoder configured to select one or more word lines coupled to one or more memory cells of the memory cell array; and
      a column decoder configured to select one or more column lines coupled to the one or more memory cells of the memory cell array,
   wherein the second data associated with operation of the memory control circuit of the memory device.

8. The memory device of claim 1,
   wherein the second data includes address data of a defective cell of the memory cell array.

9. A method for reading data from a fuse device including a fuse cell array and a fuse control circuit electrically coupled to the fuse cell array, the fuse device included in a memory device including a memory cell array and a memory control circuit electrically coupled to the memory cell array, the method comprising:
   reading first data from a first fuse cell sub-array of the fuse cell array, the first data associated with operation of the fuse control circuit; and
   after the reading the first data, reading second data from a second fuse cell sub-array of the fuse cell array, the second data associated with operation of the memory device.

10. The method of claim 9, further comprising:
   selecting the first and second data from the first and second fuse cell arrays, respectively, by an access control circuit;
   sensing and amplifying the selected first and second data by a sense amplifier; and
   transferring the amplified first data to the fuse device setting circuit, and the amplified second data to the memory control circuit by a transmission circuit.

11. The method of claim 10, wherein transferring the amplified first data to the fuse device setting circuit includes:
   generating serial data by serializing the first data and the second data; and
   generating a plurality of parallel data by deserializing the serial data.

12. The method of claim 11, wherein the first data includes information associated with at least one of operation of the access control circuit, operation of the sense amplifier, and operation of the transmission circuit.

13. The method of claim 9, wherein the second data includes defective address information that indicates one or more defective cells of the memory cell array, trimming information of level of voltage or level of current used for an operation of the memory device, or mode register set (MRS) information for setting of a mode register included in the memory device.

14. A memory device comprising:
a memory cell array including a plurality of memory cells coupled to a plurality of word lines and a plurality of bit lines;
a memory control circuit configured to select one or more memory cells in the memory cell array;
a first fuse cell array including a plurality of fuse cells coupled to a first plurality of fuse word lines and a first plurality of fuse bit lines, the first fuse cell array configured to store first data;
a second fuse cell array including a plurality of fuse cells coupled to a second plurality of fuse word lines and a second plurality of fuse bit lines, the second fuse cell array configured to store second data; and
a fuse control circuit configured to read the first and second data from the first and second fuse cell arrays, respectively, and to transfer the data to the memory control circuit,
wherein the first data is associated with operation of the fuse control circuit, and the second data is associated with operation of the memory device, and
wherein the first and second plurality of fuse word lines are the same word lines, or wherein the first and second plurality of fuse bit lines are the same bit lines.

15. The memory device of claim 14, wherein the first fuse cell array is arranged in a first region within the memory device,
wherein the second fuse cell array is arranged in a second region adjacent to the first region within the memory device, and
wherein the memory cell array is arranged in a third region within the memory device, the third region separate from and not adjacent to the first or second region.

16. The memory device of claim 14, wherein the fuse control circuit includes:
an access control circuit configured to select the first and second data from the first and second fuse cell array, respectively;
a sense amplifier configured to sense and amplify the selected first and second data; and
a transmission circuit configured to transmit the amplified first data to the fuse device setting circuit, and to transmit the amplified second data to the memory control circuit.

17. The memory device of claim 16, wherein the first data includes information associated with at least one of: operation of the access control circuit, operation of the sense amplifier, and operation of the transmission circuit.

18. The memory device of claim 17, wherein the second data includes information associated with at least one of a trimming level of voltage or current used for an operation of the memory device, an address of a defective cell of the memory cell array, and a mode register set MRS of the memory device.

19. The memory device of claim 16, wherein the fuse control circuit further includes a fuse device setting circuit configured to set the operation conditions of the fuse control circuit based on the first data read from the first fuse cell array.

20. The memory device of claim 14, further comprising:
a memory control circuit configured to select one or more memory cells in the memory cell array, wherein the memory control circuit includes:
a sense amplifier configured to sense data from the memory cell array, and to amplify the data;
a row decoder configured to select one of the word lines of the memory cell array; and
a column decoder configured to select one of the bit lines of the memory cell array.

* * * * *